United States Patent
Perez et al.

(10) Patent No.: US 11,435,426 B2
(45) Date of Patent: Sep. 6, 2022

(54) CURRENT MEASUREMENT IN POWER-GATED MICROPROCESSORS

(71) Applicant: International Business Machines Corporation, Armonk, NY (US)

(72) Inventors: Miguel E. Perez, Poughkeepsie, NY (US); Michael Sperling, Poughkeepsie, NY (US); Michael Floyd, Cedar Park, TX (US); John Francis Bulzacchelli, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 321 days.

(21) Appl. No.: 16/738,096

(22) Filed: Jan. 9, 2020

(65) Prior Publication Data
US 2021/0215785 A1    Jul. 15, 2021

(51) Int. Cl.
*G01R 35/00* (2006.01)
*G01R 19/22* (2006.01)
*H03K 5/24* (2006.01)
*H02M 3/07* (2006.01)

(52) U.S. Cl.
CPC .......... *G01R 35/007* (2013.01); *G01R 19/22* (2013.01); *H02M 3/07* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 7,027,944 B2 | 4/2006 | Tabaian et al. | |
| 7,199,565 B1 | 4/2007 | Demolli | |
| 8,892,931 B2 | 11/2014 | Kruglick | |
| 9,519,041 B2 | 12/2016 | Nemani | |
| 9,606,595 B2 | 3/2017 | Varma et al. | |
| 10,228,755 B2 | 3/2019 | Rajwan et al. | |
| 10,268,255 B2 | 4/2019 | Rosenzweig et al. | |
| 2012/0086490 A1* | 4/2012 | Doo | H03K 19/00361 327/541 |

(Continued)

FOREIGN PATENT DOCUMENTS

| | | | | |
|---|---|---|---|---|
| DE | 102019201195 B3 * | 1/2020 | | G05F 1/565 |
| KR | 1020180126933 A | 11/2018 | | |

OTHER PUBLICATIONS

Wikipedia entry for "Comparator", accessed Jul. 12, 2019, all pages (Year: 2019).*

*Primary Examiner* — Daniel C Puentes
(74) *Attorney, Agent, or Firm* — Cantor Colburn LLP; Jeffrey Ingalls

(57) ABSTRACT

Aspects of the invention include a circuit having a power header configured to couple to a power supply and to provide an output voltage. A sense circuit is coupled to the power header to receive the output voltage, the sense circuit including a replica voltage circuit coupled to a replica power header circuit and a transistor, the replica voltage circuit being configured to provide a replicated output voltage in accordance with the output voltage, the replica power header circuit being configured to couple to the power supply and the replicated output voltage to generate a replica current, the transistor being configured to deliver the replica current.

19 Claims, 6 Drawing Sheets

(56) References Cited

U.S. PATENT DOCUMENTS

| | | | |
|---|---|---|---|
| 2013/0162318 A1* | 6/2013 | Kameda | H03F 3/45659 |
| | | | 327/333 |
| 2014/0195828 A1 | 7/2014 | Varma et al. | |
| 2014/0223205 A1 | 8/2014 | Muthukaruppan et al. | |
| 2014/0277812 A1 | 9/2014 | Shih et al. | |
| 2016/0124027 A1* | 5/2016 | Sambucco | G01R 19/0092 |
| | | | 324/76.11 |
| 2016/0124455 A1* | 5/2016 | Sambucco | G05F 3/267 |
| | | | 323/315 |

\* cited by examiner

100

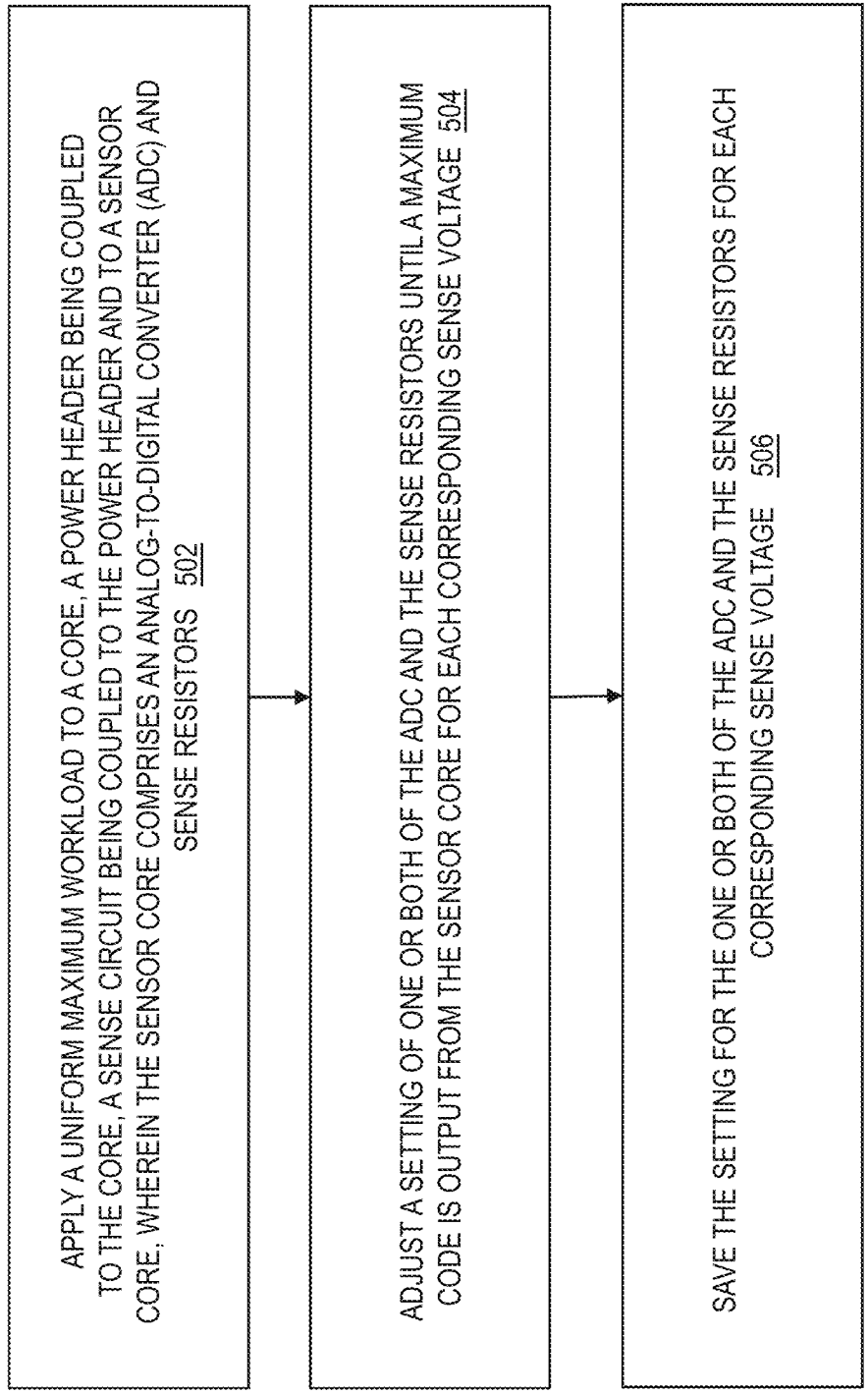

PROVIDE A POWER HEADER CONFIGURED TO COUPLE TO A POWER SUPPLY AND TO PROVIDE AN OUTPUT VOLTAGE  602

COUPLE A SENSE CIRCUIT TO THE POWER HEADER TO RECEIVE THE OUTPUT VOLTAGE, THE SENSE CIRCUIT COMPRISING A REPLICA VOLTAGE CIRCUIT COUPLED TO A REPLICA POWER HEADER CIRCUIT AND A TRANSISTOR, THE REPLICA VOLTAGE CIRCUIT BEING CONFIGURED TO PROVIDE A REPLICATED OUTPUT VOLTAGE IN ACCORDANCE WITH THE OUTPUT VOLTAGE, THE REPLICA POWER HEADER CIRCUIT BEING CONFIGURED TO COUPLE TO THE POWER SUPPLY AND THE REPLICATED OUTPUT VOLTAGE TO GENERATE A REPLICA CURRENT, THE TRANSISTOR BEING CONFIGURED TO DELIVER THE REPLICA CURRENT 604

CURRENT MEASUREMENT IN POWER-GATED MICROPROCESSORS

BACKGROUND

The present invention generally relates to integrated circuits, and more specifically, to current measurement in power-gated microprocessors.

In an electronic device, power is needed to run the device. Semiconductor devices, such as microprocessors, stand-alone and embedded memory devices, etc., receive power from a power supply or supply voltage. Power gating is a technique used in integrated circuit design to reduce power consumption, by shutting off the current to blocks of the circuit that are not in use. Power gating can use low-leakage p-channel metal-oxide-semiconductor field effect transistors (MOSFETs) as header switches to shut off power supplies to parts of a design in standby or sleep mode. N-channel MOSFETs footer switches can also be used as sleep transistors.

SUMMARY

Embodiments of the present invention are directed to current measurement in power-gated microprocessors. A non-limiting example circuit includes a power header configured to couple to a power supply and to provide an output voltage. The circuit includes a sense circuit coupled to the power header to receive the output voltage, the sense circuit including a replica voltage circuit coupled to a replica power header circuit and a transistor, the replica voltage circuit being configured to provide a replicated output voltage in accordance with the output voltage, the replica power header circuit being configured to couple to the power supply and the replicated output voltage to generate a replica current, the transistor being configured to deliver the replica current.

A non-limiting example method includes forming a circuit providing a power header configured to couple to a power supply and to provide an output voltage. The method includes coupling a sense circuit to the power header to receive the output voltage, the sense circuit including a replica voltage circuit coupled to a replica power header circuit and a transistor, the replica voltage circuit being configured to provide a replicated output voltage in accordance with the output voltage, the replica power header circuit being configured to couple to the power supply and the replicated output voltage to generate a replica current, the transistor being configured to deliver the replica current.

A non-limiting example method of calibrating a circuit includes applying a uniform maximum workload to a core, a power header being coupled to the core, a sense circuit being coupled to the power header and to a sensor core, wherein the sensor core include an analog-to-digital converter (ADC) and sense resistors. The method includes adjusting a setting of one or both of the ADC and the sense resistors until a maximum code is output from the sensor core for each corresponding sense voltage, and saving the setting for the one or both of the ADC and the sense resistors for each corresponding sense voltage.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 illustrates a flow diagram of a method for calibrating a circuit in accordance with one or more embodiments of the present invention; and FIG. 6 illustrates a flow diagram of a method for configuring a circuit in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide current measurement in power-gated microprocessors by measuring current in a processor power-gating switch header. One or more embodiments allow for the measurement of per-core power consumption in real-time for performance optimization. Current sensing circuitry (or current sensors) resides adjacent to the power header, where power headers turn power on or off to a core. A microprocessor has multiple cores, and power headers allow power to be turned off to one core independently of others. There can be rows of power headers such that there are numerous rows coupled to a core in a microprocessor.

In the state-of-the-art, it is not possible to measure per core power consumption on a multi-core microprocessor in real-time. In modern multi-core microprocessors or processors, it may be desirable to measure per-core power consumption in real-time for performance optimization. Conventional current sensing mechanisms employ either a resistor or current mirror in series with the power supply, thereby reducing the available voltage across the load. In addition, cores in processors tend to have highly variable and non-uniform current distributions, making it difficult to sense the current at a single point in the core. Finally, process variation can introduce measurement errors between multiple current sensors inside a single core.

One or more embodiments of the present invention address one or more of the above-described shortcomings of the prior art by providing one or more current measuring sense points, as current sensing circuitry (e.g., current sensors), strategically placed throughout the microprocessor. An electrical current proportional to header current is produced and delivered by the current sensing circuitry (based on the sensed current) to a central unit (e.g., sensor core) where the current is converted into voltage and digitized by an analog to digital converter (ADC) for further processing. The sensor core can use a multiplexer (MUX) type arrangement and the ADC to digitize the analog voltage generated from several current sensor readings. Additional logic processes information before delivery to a processor power management unit (PPMU).

Figure 1:
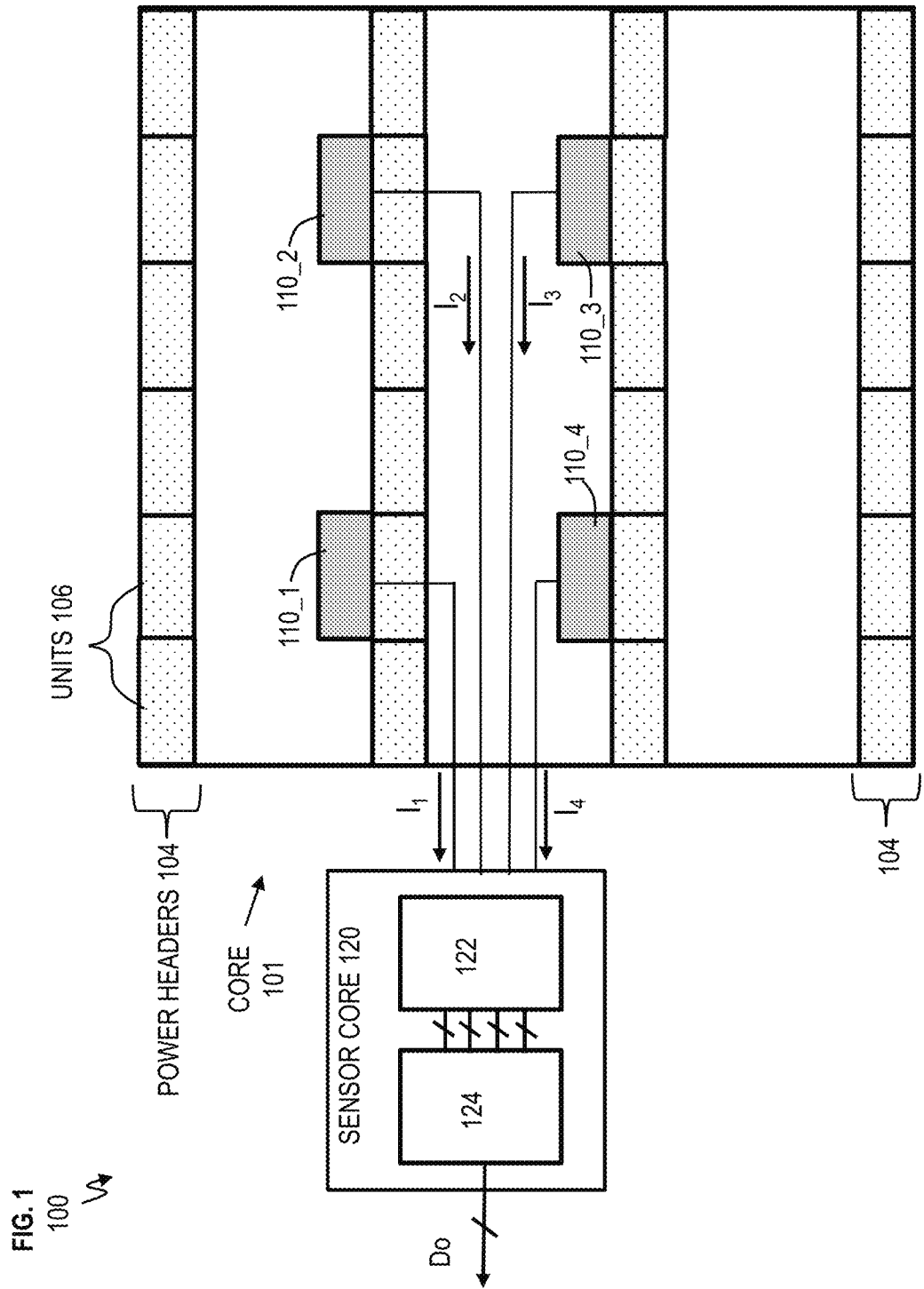
FIG. 1 illustrates a block diagram of an example circuit in accordance with one or more embodiments of the present invention.

Referring to FIG. 1, a high-level block diagram illustrates an integrated circuit 100 in accordance with one or more embodiments of the present invention. The integrated circuit 100 includes a core (CPU) 101 coupled to a sensor core 120. The core 101 includes rows of power headers 104 to provide power to various sections/blocks inside the core 101. Although a single core 101 is shown with four rows of power headers 104, the core 101 can have fewer or more than four rows of power headers. In addition, a microprocessor can have one or more cores, each having fewer or more than four rows of power headers.

Each of the power headers 104 has a power header unit 106. Each power header unit 106 includes a power header transistor 202 shown in FIG. 2. The power header transistor 202 can be referred to as a p-type field effect transistor (PFET) and/or power header PFET. The individual power header units 106 provide power to different sections/blocks of the core 101. Sense circuits 110_1, 110_2, 110_3, and 110_4, generally referred to as sense circuits 110, are strategically distributed across different locations of the core 101 to individually measure current (e.g., at respective sense points). The sense circuits 110 are positioned to abut and couple to the particular power header units 106 being measured. In the example shown in FIG. 1, sense circuits 110_1, 110_2, 110_3, and 110_4 respectively monitor and generate a scaled version of the current flowing through their abutting power header units 106. For example, scaled electrical currents $I_1$, $I_2$, $I_3$, and $I_4$ are respectively generated by sense circuits 110_1, 110_2, 110_3, and 110_4 and delivered to sensor core 120 for processing. The sensor core 120 is outside of core 101 but remains in close proximity. This reduces area requirements for the current sensing circuitry inside the (processor) core 101 (or cores if more than one), where area is at a premium.

The sensor core 120 includes an analog-to-digital converter (ADC) 122 and a digital block 124. The sensor core outputs a code Do (i.e., output code) that can represent the maximum current sensor reading, minimum current sensor reading, a single current reading, and/or the average of the current sensor readings depending on the chosen setting. The code Do can be, for example, an N bit code. More regarding the sensor core 120 will be discussed herein.

Figure 2:
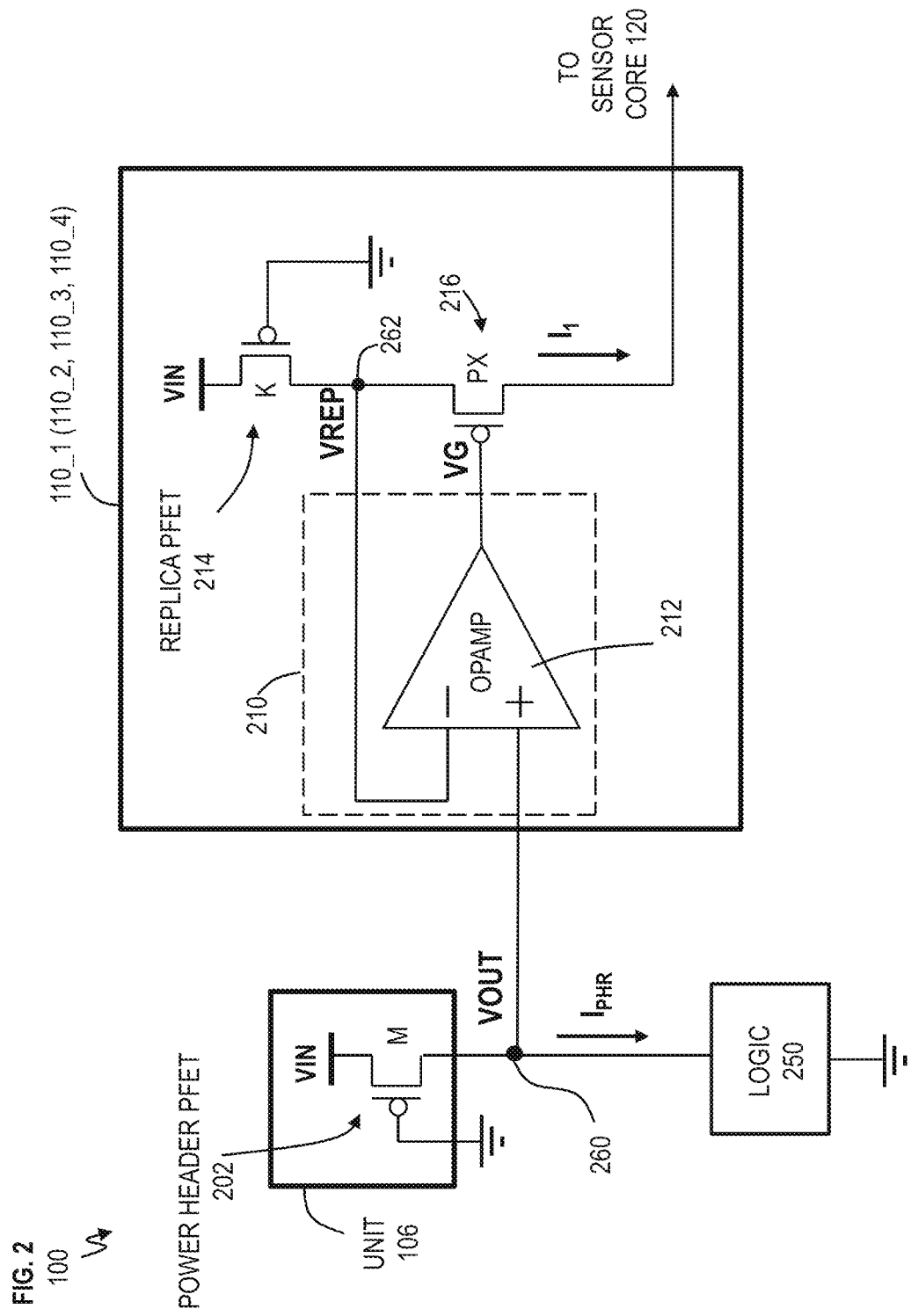
FIG. 2 illustrates a block diagram with details of the circuit in accordance with one or more embodiments of the present invention.

Now turning to FIG. 2, a block diagram illustrates further details inside the sense circuits 110 and power header unit 106 in accordance with one or more embodiments of the present invention. Although an example describes sense circuit 110_1 which produces electrical current $I_1$ as a scaled down version of power header current $I_{PHR}$ through its adjacent power header unit 106, discussion applies by analogy to sense circuits 110_2, 110_3, 110_4 producing their respective electrical currents $I_2$, $I_3$, $I_4$ as scaled down versions of power header currents $I_{PHR}$ through their respective adjacent power header units 106.

In FIG. 2, each power header unit 106 includes the power header transistor 202 shown as a PFET having its source coupled to input voltage (VIN) from a power supply and its drain coupled to node 260, and the drain provides output voltage (VOUT) and power header unit current $I_{PHR}$ to logic 250. The gate of power header transistor 202 is coupled to ground but can be switched to a high voltage for power gating as understood by one skilled in the art. The power header transistor 202 (e.g., PFET) has a width or number of fins M, depending on whether the semiconductor technology uses planar or finFET (fin field effect transistor) devices. The power header unit 106 couples to logic 250, which can include various types of logic gates, logic devices, registers, etc.

FIG. 2 illustrates a replica voltage circuit 210 which includes operational amplifier 212. The noninverting terminal (e.g., positive terminal) of operational amplifier 212 is connected to node 260 to receive output voltage (VOUT). The inverting terminal of operational amplifier 212 is connected to node 262. The operational amplifier 212 is configured to provide replica voltage (VREP) at node 262 which is connected to the drain of replica transistor 214. The replica transistor 214 (also referred to as replica power header transistor) is a scaled down replica of power header transistor 202. The replica voltage (VREP) is controlled by the replica voltage circuit 210 (e.g., operational amplifier 212 in FIG. 2) to be equal to output voltage (VOUT) produced by power header unit 106 (e.g., power header transistor 202). The replica transistor 214 can correspondingly be a PFET, and the PFET has a width or number of fins K, where K is smaller than M. The source of replica transistor 214 is connected to input voltage (VIN) from the power supply and its gate is connected to ground, analogous to power header transistor 202. The output terminal of the operational amplifier 212 is connected to transistor 216, which can be a PFET. Transistor 216 is used in a source follower configuration, in which its source is connected to node 262, so that in conjunction with replica voltage circuit 210, it drives node 262 to have the replica voltage (VREP) equal to output voltage (VOUT). The drain of transistor 216 is connected to the sensor core 120 to provide replica current $I_1$, which would be by analogy replica currents $I_2$, $I_3$, and $I_4$ respectively for sense circuits 110_2, 110_3, 110_4.

The sense circuit 110_1 is configured to estimate the value of $I_{PHR}$ from its adjacent power header unit 106. Similarly, sense circuit 110_2, 110_3, 110_4 are configured to estimate the respective values of $I_{PHR}$ from their adjacent power header units 106. The replica voltage circuit 210 (e.g., illustrated as operational amplifier 212 in FIG. 2, and illustrated as comparator 312 and charge pump 320 in FIG. 3) ensures that replica voltage VREP equals output voltage VOUT so that current through replica transistor 214 (e.g., replica PFET) is a scaled version of current through power header transistor 202 (e.g., power header PFET), i.e., $I_1 = (K/M)^* I_{PHR}$ and the same relationship analogously applies for the other replica currents. Replica current $I_1$ is sent to the sensor core 120 to be converted into a sense voltage $V_{SENSE1}$ and subsequently digitized by ADC 122. The value of replica voltage (VREP) increases and decreases with the value of gate voltage (VG), as a result of PFET transistor 216 being used in a source follower configuration.

Figure 3:
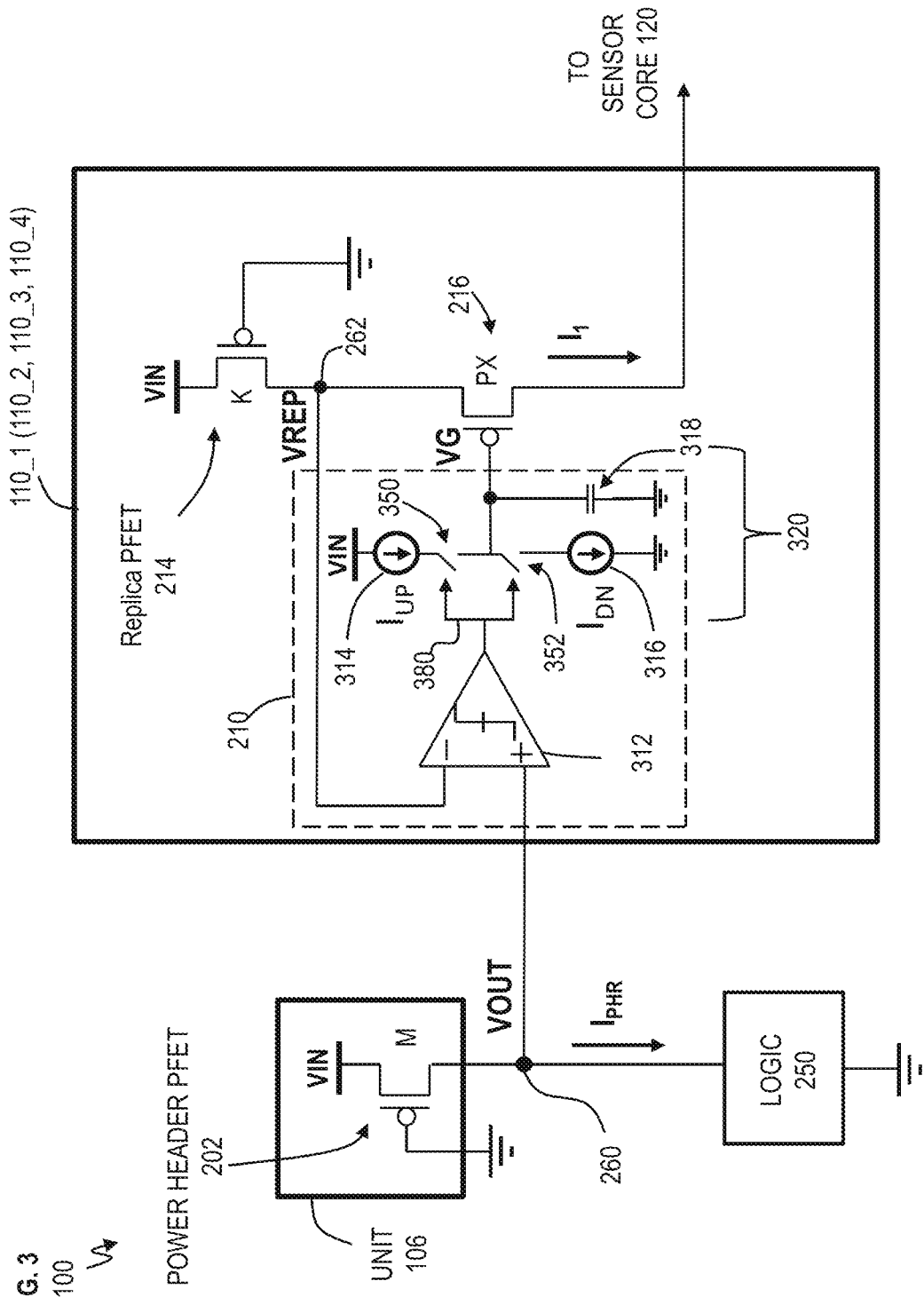
FIG. 3 illustrates a block diagram with details of the circuit in accordance with one or more embodiments of the present invention.

Although the replica voltage circuit 210 is illustrated with an example operational amplifier 212, the replica voltage circuit 210 is not meant to be limited. FIG. 3 illustrates a block diagram of an example replica voltage circuit 210 with a comparator 312 and charge pump 320 in accordance with one or more embodiments of the present invention. Using the comparator 312 and charge pump 320 can have advantages over using an operational amplifier. For example, the comparator 312 and charge pump 320 may have infinite direct current (DC) gain, which eliminates the average error with respect to the relationship: Error=VREP−VOUT. In the case of the operational amplifier, the average error is always finite due to the operational amplifier's finite DC gain. Additionally, the gain of the operational amplifier varies across the range of input signal values, often decreasing as its input approaches the supply voltage providing power to the operational amplifier, a limitation not encountered by the comparator 312 and charge pump 320. However, unlike an operational amplifier, the inherent oscillatory behavior of comparator 312 in conjunction with charge pump 320 could cause an unwanted ripple at gate voltage (VG) and at replica voltage VREP, which could translate into unwanted ripple in replica current $I_1$. This ripple in replica current $I_1$ is filtered out by the parallel combination of resistor $R_{SNS}$ and capacitor $C_{SNS}$ shown in FIG. 4.

Referring to FIG. 3, the positive input terminal of the comparator 312 is connected to node 260 to receive output voltage (VOUT), while its negative input terminal is connected to node 262 to receive replica voltage (VREP). The comparator 312 is coupled to charge pump 320. The charge pump 320 includes a pullup current source 314 coupled to input voltage (VIN) of the power supply and coupled to switch 350. The charge pump 320 includes pulldown current source 316 coupled to ground and also coupled to switch 352. Switch 350 and switch 352 are coupled to the gate terminal of PFET transistor 216. Capacitor 318 has a positive terminal connected to the gate terminal of PFET transistor 216 while its negative terminal is coupled to ground. When VREP is less than VOUT, the output of the comparator 312 is high (e.g., VIN) which closes switch 350 and opens switch 352 (e.g., via logic 380), thereby charging capacitor 318 and raising the value of voltage VG. This in turn causes replica voltage VREP to increase until VREP >VOUT. When VREP is greater than VOUT, the output of the comparator 312 is low (e.g., ground) which opens switch 350 and closes switch 352, thereby discharging capacitor 318 and lowering the value of voltage VG. This in turn causes replica voltage VREP to decrease until VREP <VOUT. Alternately, the positive terminal of capacitor 318 could be connected to the power supply VIN and its negative terminal could be connected to the gate terminal of PFET transistor 216. This alternate configuration of capacitor 318 effectively AC couples node VG to the power supply voltage VIN helping to maintain accurate current sensor performance in the face of fast VIN transients.

Figure 4:
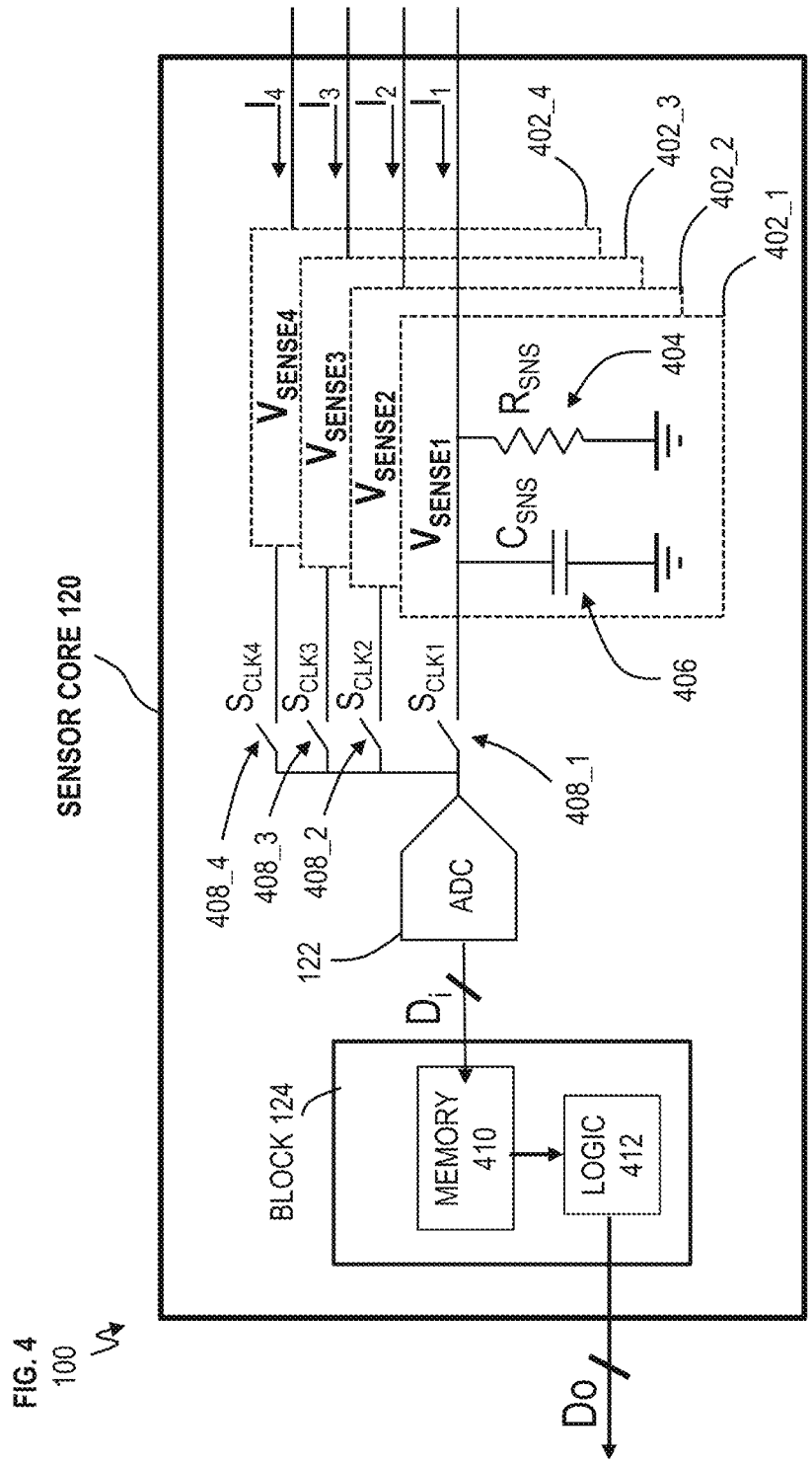
FIG. 4 illustrates a block diagram with details of the circuit in accordance with one or more embodiments of the present invention.

FIG. 4 illustrates a block diagram of an example sensor core 120 with further details in accordance with one or more embodiments of the present invention. Current from each of the current sensors (i.e., sense circuits 110) is delivered to the sensor core 120 to be processed. For example, each of the replica or sense currents $I_1$, $I_2$, $I_3$, and $I_4$, respectively from sense circuit 110_1, sense circuit 110_2, sense circuit 110_3, and sense circuit 110_4 is fed into a specific resistor-capacitor (RC) network 402_1, 402_2, 402_3, and 402_4, known collectively as RC networks 402.

For example, current $I_1$ will flow through the parallel combination of sense resistor 404 ($R_{SNS}$) and sense capacitor 406 ($C_{SNS}$) producing a voltage $V_{SENSE1}$ across RC network 402_1. $V_{SENSE1}$ will be subsequently sampled by the ADC 122 through the periodic closing of switch 408_1 ($S_{CLK1}$) every $T_S$ seconds given a clock signal connected to ADC 122. Analogously, currents $I_2$, $I_3$, and $I_4$ will be converted into sense voltages $V_{SENSE2}$, $V_{SENSE3}$, and $V_{SENSE4}$ after flowing through their respective RC networks 402_2, 402_3 and 402_4. Finally, sense voltages $V_{SENSE1}$, $V_{SENSE2}$, $V_{SENSE3}$, and $V_{SENSE4}$ will be digitally stored in memory 410 after sampling and conversion by ADC 122. These digitized voltage readings (e.g., Di, where i is equal to 1 through Y) of $V_{SENSE1}$, $V_{SENSE2}$, $V_{SENSE3}$, $V_{SENSE4}$ can then be processed by logic 412 in a variety of ways to extract minimum sense voltage, maximum sense voltage, average sense voltage, etc., and output as code (e.g., code Do). Y is the number of incoming current readings (e.g., sense currents $I_1$, $I_2$, $I_3$, $I_4$ where Y=4 in this example) and/or the number of current sensors used across the core 101 (e.g., sense circuits 110_1, 110_2, 110_3, 110_4, where Y=4 current sensors in this example). As noted above, the sensor core 120 outputs Do as an N bit code, which can represent the maximum, minimum, a single reading, and/or the average of the current sensor readings depending on the setting in digital block 124. As ADC 122 needs to sample Y sense voltages (e.g., $V_{SENSE1}$, $V_{SENSE2}$, $V_{SENSE3}$, and $V_{SENSE4}$ in this case) sequentially, its conversion time $T_{ADC}$ should be significantly less than $T_S$ (e.g., $T_{ADC} \ll T_S$) to ensure a minimum sampling rate of at least $1/T_S$ for each sense voltage. This is performed in order to obtain as accurate a measurement as possible of a core's average current consumption over a period of time $T_S$.

In one or more embodiments of the invention, RC networks 402 can also be connected in parallel, thereby producing a single RC network with a sense resistor of value $R_{SNS}/Y$ and a sense capacitor of value $C_{SNS}*Y$. This configuration effectively shorts all the incoming wires and feeds the sum of the currents (current $I_1$, $I_2$, $I_3$, $I_4$) through a resistor of value $R_{SNS}/Y$ to generate a voltage $V_{SENSE}$ that represents the average value of all the currents $I_1$, $I_2$, $I_3$, $I_4$.

FIG. 5 illustrates a flow diagram of a method 500 for calibrating current measurement in the circuit 100 in accordance with one or more embodiments of the present invention. Process variation may cause the current sensor core 120 to read incorrectly and/or the ADC 122 to introduce errors. FIG. 5 depicts method 500 to calibrate the process variation by applying a workload (e.g., instructions) in the core 101 for generating a known maximum current and then adjusting the ADC 122 and/or sense resistors 404 to output the maximum code at that point corresponding to maximum current.

At block 502, method 500 includes applying a uniform maximum workload to core 101. Uniform maximum workload means that a core workload representing the maximum amount of current consumption expected in a processor core is applied uniformly across the core to be calibrated. Uniformly means that all power header units 106 conduct equal or approximately equal amounts of current. The core 101 is coupled to power headers 104 and sense circuits 110. The sense circuits 110 are coupled to sensor core 120 which has ADC 122 and sense resistor 404.

At block 504, the method 500 includes adjusting a setting of either ADC 122, (variable) sense resistor 404 ($R_{SNS}$) in every RC network 402_1, 402_2, 402_3 and 402_4, and/or both until a maximum code for code Do is output for each corresponding Di voltage reading. The maximum code (e.g., 111 . . . 1111) from sensor core 120 can represent maximum current from the core 101. As one example, this can be accomplished by a calculation or loop through all the settings of the ADC 122 and/or sense resistor 404 from each RC network 402_1, 402_2, 402_3 and 402_4, until a maximum code is obtained for code Do for each corresponding Di voltage reading. This calculation or loop through is implemented once per RC network 402, as switches 408_1, 408_2, 408_3 and 408_4 close in sequence thereby coupling ADC 122 to each RC network 402_1, 402_2, 402_3 and 402_4, respectively. Settings of the sense resistor 404 are the different resistance values. The settings of the ADC 122 are the different voltage reference values generated from an internal digital-to-analog converter (DAC).

At block 506, the method 500 includes saving the settings of the ADC 122 and/or sense resistor 404 corresponding to each RC network 402_1, 402_2, 402_3 and 402_4 just determined for use during normal operation. The blocks 502, 504, and 506 can be repeated for each core 101. Also, in one or more embodiments, blocks 502, 504, and 506 can be performed in parallel for each of the cores 101 in a microprocessor.

FIG. 6 illustrates a flow diagram of a method 600 for configuring a circuit in accordance with one or more embodiments of the present invention. At block 602, the method 600 includes providing a power header 104 configured to couple to a power supply (e.g., input voltage VIN) and to provide an output voltage (e.g., VOUT). At block 604, the method 600 includes coupling a sense circuit 110 to the power header 104 to receive the output voltage (e.g., VOUT), the sense circuit 110 having a replica voltage circuit 210 coupled to a replica power header circuit (e.g., replica transistor 214) and a transistor 216, the replica voltage circuit 210 being configured to provide a replicated output voltage (e.g., VREP) in accordance with the output voltage (e.g., VOUT), the replica power header (e.g., replica transistor 214) being configured to couple to the power supply (e.g., input voltage VIN) and the replicated output voltage (e.g., VREP) to generate a replica current (e.g., replica current $I_1$, $I_2$, $I_3$, and/or $I_4$), the transistor 216 being configured to deliver the replica current (e.g., replica current $I_1$, $I_2$, $I_3$, and/or $I_4$).

The power header 104 is configured to provide an output current to at least one core 101. Each power header 104 has a power header unit 106. The replica power header circuit (e.g., replica transistor 214) is configured to provide a replica current (e.g., replica current $I_1$, $I_2$, $I_3$, and/or $I_4$) as a scaled down version of an output current (e.g., power header current $I_{PHR}$) provided by the power header unit 106.

The sense circuit 110 is coupled to a central circuit block (e.g., sensor core 120). The central circuit block (e.g., sensor core 120) is configured to digitize a sense voltage (e.g., $V_{SENSE1}$, $V_{SENSE2}$, $V_{SENSE3}$, and/or $V_{SENSE4}$) according to a replica current (e.g., replica current $I_1$, $I_2$, $I_3$, and/or $I_4$) provided by the replica power header circuit (e.g., replica transistor 214). The transistor 216 is configured to deliver the replica current generated by the replica power header circuit to the sensor core 120, and the replica current is a scaled down version of an output current ($I_{PHR}$) provided by the power header unit 106.

In one or more embodiments, the replica voltage circuit 210 includes an amplifier 212. A noninverting terminal of the amplifier 212 is coupled to the power header unit 106 to receive the output voltage (e.g., VOUT), an inverting terminal of the amplifier 212 is coupled to the replica power header circuit (e.g., replica power header transistor 214) to receive the replicated output voltage (e.g., VREP), and an output terminal of the amplifier 212 is coupled to a gate terminal of the transistor 216.

In one or more embodiments, the replica voltage circuit 210 includes a comparator 312 and a charge pump 320. The charge pump 320 includes a pullup circuit (e.g., pullup current source 314 coupled to input voltage (VIN) of power supply and switch 350), and a pulldown circuit (e.g., pulldown current source 316 coupled to ground and to switch 352). The charge pump 320 further includes a capacitor 318 in parallel with the pulldown circuit and coupled to the gate terminal of the transistor 216. A first input terminal of the comparator 312 is coupled to the power header unit 106 to receive the output voltage (e.g., VOUT), and a second input terminal of the comparator 312 is coupled to the replica power header circuit (e.g., replica power header transistor 214) to receive the replicated output voltage (e.g., VREP). The output terminal of the comparator 312 is coupled to logic 380 that controls the ON/OFF state of switches 350 and 352.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/ connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A circuit comprising:
   a power header configured to couple to a power supply and to provide an output voltage; and
   a sense circuit coupled to the power header to receive the output voltage, the sense circuit comprising a replica voltage circuit coupled to a replica power header circuit and a transistor, the replica voltage circuit being configured to control a replicated output voltage in accordance with the output voltage, the replica power header circuit being configured to couple to the power supply and the replicated output voltage to generate a replica current, wherein a selected terminal of the replica power header circuit is connected to both an input of the replica voltage circuit and the transistor, the transistor being connected to and configured to deliver electrical current as the replica current to a sensor core, the sensor core being configured to sample sense voltages associated with one or more replica currents.

2. The circuit of claim 1, wherein the power header is configured to provide an output current to part of one core.

3. The circuit of claim 1, wherein the replica power header circuit is configured to provide the replica current as a scaled down version of an output current provided by the power header.

4. The circuit of claim 1, wherein the sense circuit is coupled to a central circuit block.

5. The circuit of claim 1, wherein a central circuit block is configured to digitize a sense voltage according to the replica current provided by the replica power header circuit, the replica current being a scaled down version of an output current provided by the power header.

6. The circuit of claim 1, wherein the replica voltage circuit comprises an amplifier.

7. The circuit of claim 6, wherein:
   a noninverting terminal of the amplifier is coupled to the power header to receive the output voltage;
   an inverting terminal of the amplifier is coupled to the replica power header circuit to receive the replicated output voltage; and
   an output terminal of the amplifier is coupled to a gate terminal of the transistor that is coupled to the sensor core.

8. The circuit of claim 1, wherein the replica voltage circuit comprises a charge pump.

9. The circuit of claim 8, wherein:
   the charge pump comprises a pullup circuit and a pulldown circuit each of which is coupled to a separate switch controlled by logic, the logic being coupled to an output terminal of a comparator; and
   the charge pump further comprises a capacitor in parallel with the pulldown circuit and coupled to a gate terminal of the transistor.

10. The circuit of claim 9, wherein:
    a first terminal of the comparator is coupled to the power header to receive the output voltage; and
    a second terminal of the comparator is coupled to the replica power header circuit to receive the replicated output voltage.

11. A method of forming a circuit, the method comprising:
    providing a power header configured to couple to a power supply and to provide an output voltage; and
    coupling a sense circuit to the power header to receive the output voltage, the sense circuit comprising a replica voltage circuit coupled to a replica power header circuit and a transistor, the replica voltage circuit being configured to control a replicated output voltage in accordance with the output voltage, the replica power header circuit being configured to couple to the power supply and the replicated output voltage to generate a replica current, wherein a selected terminal of the replica power header circuit is connected to both an input of the replica voltage circuit and the transistor, the transistor being connected to and configured to deliver electrical current as the replica current to a sensor core, the sensor core being configured to sample sense voltages associated with one or more replica currents.

12. The method of claim 11, wherein the power header is configured to provide an output current to part of one core.

13. The method of claim 11, wherein the replica power header circuit is configured to provide the replica current as a scaled down version of an output current provided by the power header.

14. The method of claim 11, wherein the sense circuit is coupled to a central circuit block.

15. The method of claim 11, wherein a central circuit block is configured to digitize a sense voltage according to the replica current provided by the replica power header circuit, the replica current being a scaled down version of an output current provided by the power header.

16. The method of claim 11, wherein the replica voltage circuit comprises an amplifier.

17. The method of claim 16, wherein:
a noninverting terminal of the amplifier is coupled to the power header to receive the output voltage;
an inverting terminal of the amplifier is coupled to the replica power header circuit to receive the replicated output voltage; and
an output terminal of the amplifier is coupled to a gate terminal of the transistor.

18. The method of claim 11, wherein the replica voltage circuit comprises a charge pump.

19. The method of claim 18, wherein:
the charge pump comprises a pullup circuit and a pulldown circuit each of which is coupled to a separate switch controlled by logic, the logic being coupled to an output terminal of a comparator;
the charge pump further comprises a capacitor in parallel with the pulldown circuit and coupled to a gate terminal of the transistor;
a first terminal of the comparator is coupled to the power header to receive the output voltage; and
a second terminal of the comparator is coupled to the replica power header circuit to receive the replicated output voltage.

\* \* \* \* \*